US011680980B2

(12) United States Patent
Tremmel et al.

(10) Patent No.: US 11,680,980 B2
(45) Date of Patent: Jun. 20, 2023

(54) SEMICONDUCTOR BURN-IN OVEN CHAMBER SEALING

(71) Applicant: Micro Control Company, Fridley, MN (US)

(72) Inventors: Tom Alan Tremmel, New Brighton, MN (US); John Thomas McElreath, Mahtomedi, MN (US)

(73) Assignee: MICRO CONTROL COMPANY, Fridley, MN (US)

( * ) Notice: Subject to any disclaimer, the term of this patent is extended or adjusted under 35 U.S.C. 154(b) by 0 days.

(21) Appl. No.: 17/476,530

(22) Filed: Sep. 16, 2021

(65) Prior Publication Data

US 2022/0082611 A1   Mar. 17, 2022

Related U.S. Application Data

(60) Provisional application No. 63/079,044, filed on Sep. 16, 2020.

(51) Int. Cl.
*G01R 31/28* (2006.01)
*F27D 1/18* (2006.01)
*F27B 17/00* (2006.01)

(52) U.S. Cl.
CPC ...... *G01R 31/2849* (2013.01); *F27B 17/0025* (2013.01); *F27D 1/18* (2013.01)

(58) Field of Classification Search
CPC .......... F27B 17/0025; F27B 9/10; F27B 9/16; F27B 9/3005; F27B 9/36; F27B 9/30;
(Continued)

(56) References Cited

U.S. PATENT DOCUMENTS 5,093,982 A * 3/1992 Gussman ........... G01R 31/2867
29/244
5,195,827 A    3/1993 Audy et al.
(Continued)

FOREIGN PATENT DOCUMENTS

KR     20210106710    *  8/2021
TW      201428247        7/2014
(Continued)

OTHER PUBLICATIONS

International Search Report and Written Opinion of PCT/US2015/014562, dated Apr. 23, 2015.
(Continued)

*Primary Examiner* — Vinh P Nguyen
(74) *Attorney, Agent, or Firm* — Brian D. Kaul; Westman, Champlin & Koehler, P.A.

(57) ABSTRACT

A semiconductor burn-in oven includes a housing including a burn-in chamber and an opening to the burn-in chamber surrounded by a front face, a heating device, testing circuitry, a door and a sealing mechanism. The door has an open position, in which the burn-in chamber is accessible through the opening, and a closed position, in which the door covers the opening. The sealing mechanism is configured to form a seal around the opening between an interior side of the door and the front face when the door is in the closed position. The sealing mechanism includes at least one sealing member having a recessed position, in which a gap extends between the front face and the interior side of the door, and a sealing position, in which the at least one sealing member closes the gap and forms the seal.

20 Claims, 7 Drawing Sheets

(58) Field of Classification Search
CPC ......... F27B 9/20; F27D 1/18; G01R 31/2849; G01R 31/2862; G01N 27/10; G01N 33/1893; F28F 9/167; F23M 5/08; F23M 9/04; F23M 9/06; F28D 17/02
See application file for complete search history.

(56) References Cited

U.S. PATENT DOCUMENTS

| | | | |
|---|---|---|---|
| 5,359,285 | A | 10/1994 | Hashinaga et al. |
| 5,582,235 | A | 12/1996 | Hamilton et al. |
| 6,169,442 | B1 | 1/2001 | Meehan et al. |
| 6,332,710 | B1 | 12/2001 | Aslan et al. |
| 6,554,469 | B1 | 4/2003 | Thomson et al. |
| 7,150,561 | B1 | 12/2006 | D'Aquino et al. |
| 7,252,432 | B1 | 8/2007 | Henderson et al. |
| 7,271,605 | B2 * | 9/2007 | Naitou ............... G01R 31/2865 324/750.19 |
| 7,288,951 | B1 | 10/2007 | Bailey et al. |
| 7,378,836 | B2 * | 5/2008 | Teoh ................ G01R 31/2867 324/750.05 |
| 7,461,974 | B1 | 12/2008 | Aslan et al. |
| 7,650,762 | B2 | 1/2010 | Hamilton et al. |
| 7,826,998 | B1 | 11/2010 | Taheri et al. |
| 7,959,175 | B2 * | 6/2011 | Kato ..................... B60G 7/008 280/124.166 |
| 9,366,721 | B2 * | 6/2016 | Teoh .................. G01R 31/2877 |
| 10,126,177 | B2 | 11/2018 | Olson et al. |
| 10,342,883 | B2 * | 7/2019 | Zambaux ............... F26B 25/08 |
| 2005/0036352 | A1 | 2/2005 | Norris et al. |
| 2006/0049843 | A1 | 3/2006 | Jenkins et al. |
| 2006/0063285 | A1 | 3/2006 | Miller |
| 2006/0265174 | A1 | 11/2006 | Doyle et al. |

FOREIGN PATENT DOCUMENTS

| | | |
|---|---|---|
| TW | 201501099 | 1/2015 |
| TW | 201539003 | 10/2015 |
| WO | 2015123078 A1 | 8/2015 |

OTHER PUBLICATIONS

ADT7461 ±1° C. Temperature Monitor with Series Resistance Cancellation, May 2012—Rev. 7 © Semiconductor Components Industries, LLC, http://onsemi.com, 20 pages.
Hughes, Ronnie D., "Remote Diodes yield accurate temperature measurements," Jul. 10, 2003, www.edn.com, pp. 59-62.
±1° C. Temperature Sensor with Series-R, η-Factor, and Automatic Beta Compensation, Texas Instruments Incorporated, Copyright © 2009-2013, 42 pages.
English translation of Office Action including a Search Report for Taiwan Patent Application No. 104104589, dated Jun. 27, 2018.

* cited by examiner

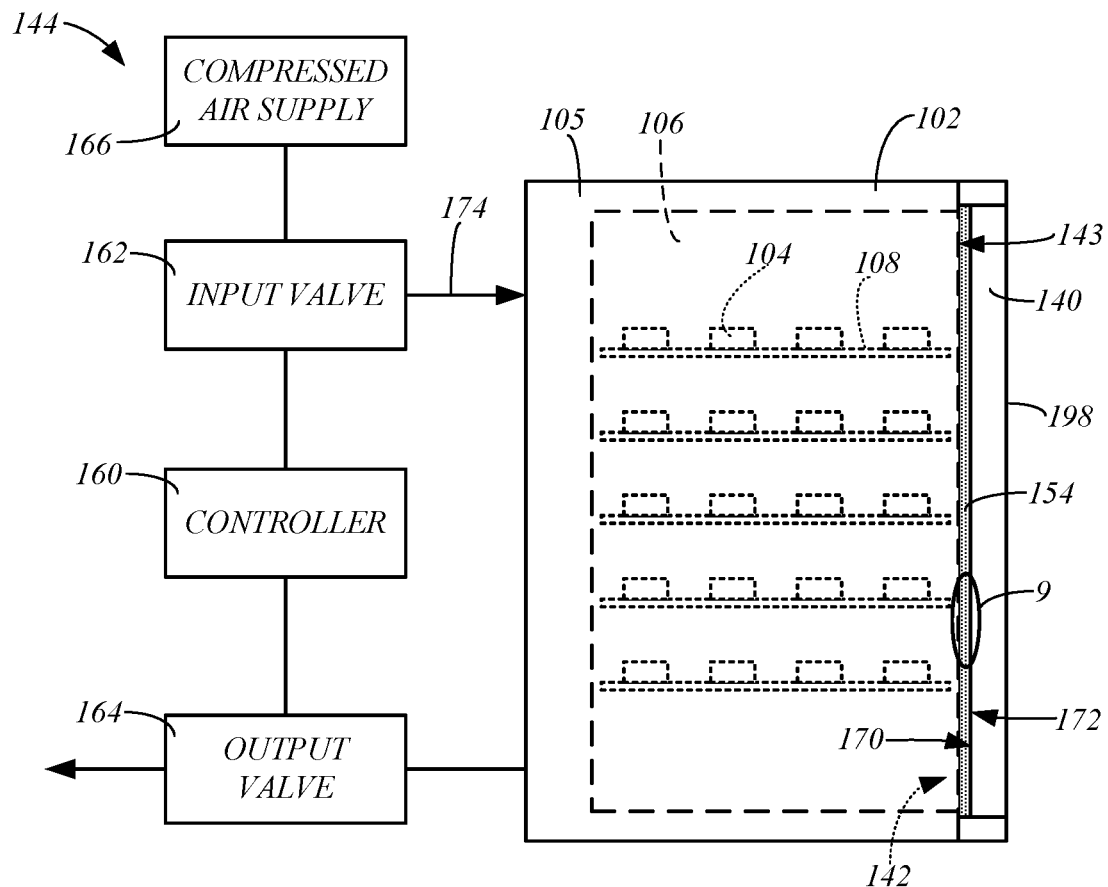
FIG. 8
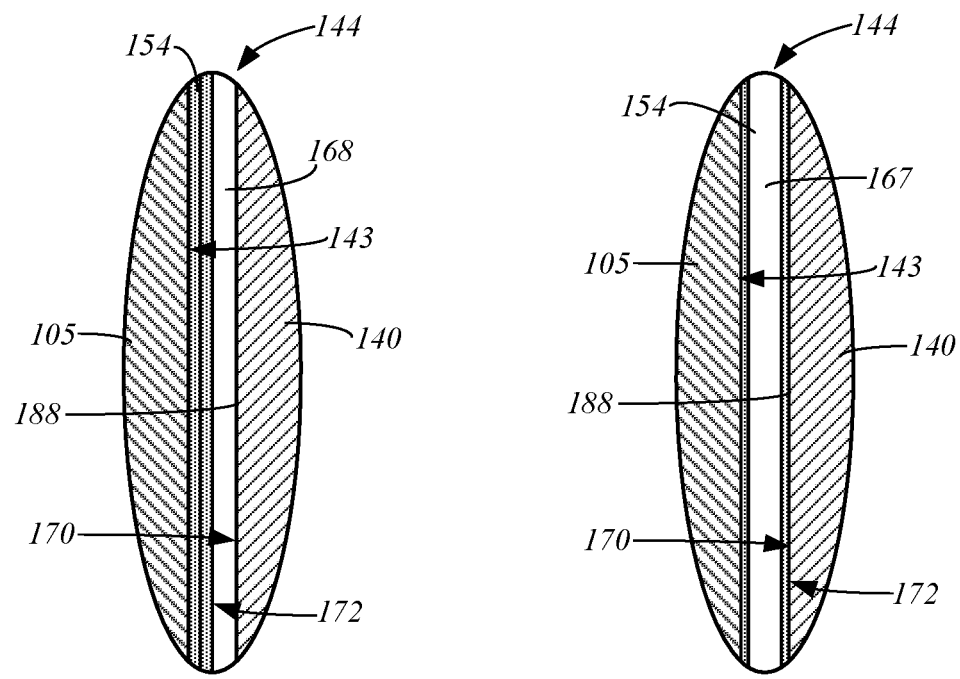
FIG. 9A
FIG. 9B

SEMICONDUCTOR BURN-IN OVEN CHAMBER SEALING

CROSS-REFERENCE TO RELATED APPLICATION

The present application is based on and claims the benefit of U.S. provisional patent application Ser. No. 63/079,044, filed Sep. 16, 2020, the content of which is hereby incorporated by reference in its entirety.

BACKGROUND

Semiconductor devices, such as silicon integrated circuit chips or other semiconductor devices, are subject to early failure during their life cycle. It is desirable to detect and eliminate the devices that are most prone to early failure prior to sending them to market. Additionally, it is desirable to identify the components of the semiconductor devices that cause the early failures so that they may be improved. Thus, producers of these devices have found it cost-effective to utilize burn-in systems to rigorously temperature stress the semiconductor devices while simultaneously powering them in order to test the reliability of the devices.

Burn-in test systems typically include a burn-in oven having a testing chamber that houses a plurality of burn-in boards, each of which supports a number of semiconductor devices to be tested. The burn-in test system powers the devices under test and exposes the devices to heat stress over an extended period of time. During burn-in temperature stressing of the chips, heat exchange systems are employed to maintain the chips within a desired temperature range to prevent overheating of the chips, which can damage properly functioning chips. A determination of the reliability of the devices can be made based on the actual semiconductor die temperature during the test. Examples of such systems are described in U.S. Pat. Nos. 7,288,951 and 7,650,762, which issued to Micro Control Company and are incorporated herein by reference in their entirety.

SUMMARY

Embodiments of the present disclosure relate to techniques for sealing an opening to a burn-in oven chamber of a burn-in system, in which semiconductor devices are tested under various conditions, such as high heat (e.g., up to 150° C.). Certain embodiments are directed to semiconductor burn-in ovens, and methods of operating the semiconductor burn-in ovens.

In one embodiment, a semiconductor burn-in oven includes a housing, a heating device, testing circuitry, a door and a sealing mechanism. The housing includes a burn-in chamber and an opening to the burn-in chamber surrounded by a front face. The heating device is configured to heat the burn-in chamber. The testing circuitry is configured to power semiconductor devices received within the burn-in chamber. The door has an open position, in which the burn-in chamber is accessible through the opening, and a closed position, in which the door covers the opening. The sealing mechanism is configured to form a seal around the opening between an interior side of the door and the front face of the housing when the door is in the closed position. The sealing mechanism includes at least one sealing member having a recessed position, in which a gap extends between the front face of the housing and the interior side of the door, and a sealing position, in which the at least one sealing member closes the gap and forms a seal between the front face of the housing and the interior side of the door.

Another embodiment of a semiconductor burn-in oven includes a housing, a heating device, testing circuitry, a door, a motorized carriage, and a sealing mechanism. The housing includes a burn-in chamber and an opening to the burn-in chamber surrounded by a front face. The heating device is configured to heat the burn-in chamber. The testing circuitry is configured to power semiconductor devices received within the burn-in chamber. The door has an open position, in which the burn-in chamber is accessible through the opening, and a closed position, in which the door covers the opening. The motorized carriage is configured to drive the door along an axis that extends along the front face of the housing between the open and closed positions. The sealing mechanism is configured to form a seal around the opening between an interior side of the door and the front face of the housing when the door is in the closed position. The sealing mechanism includes a supply of compressed air, and at least one sealing member. Each sealing member has a recessed position, in which a gap extends between the front face of the housing and the interior side of the door, and a sealing position, in which the sealing member closes the gap and forms a seal between the front face of the housing and the interior side of the door. The sealing mechanism is configured to direct a flow of compressed air from the compressed air supply into an interior chamber of each sealing member to inflate each sealing member and transition each sealing member from the recessed position to the sealing position. The sealing mechanism is configured to direct a flow of air out of the interior chamber of each sealing member to transition each sealing member from the sealing position to the recessed position.

One embodiment of the method relates to the operation of a semiconductor burn-in oven that includes a housing, a heating device, testing circuitry, a door and a sealing mechanism. The housing includes a burn-in chamber and an opening to the burn-in chamber surrounded by a front face. The heating device is configured to heat the burn-in chamber. The testing circuitry is configured to power semiconductor devices received within the burn-in chamber. The door has an open position, in which the burn-in chamber is accessible through the opening, and a closed position, in which the door covers the opening. The sealing mechanism includes at least one sealing member. In the method, the door is moved from the open position to the closed position. Each sealing member is transitioned from a recessed position, in which a gap extends between the front face of the housing and an interior side of the door, to a sealing position, in which each sealing member closes the gap and forms a seal between the front face of the housing and the interior side of the door.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

FIG. 8 is a simplified diagram of an example of a sealing mechanism of a semiconductor burn-in oven, in accordance with embodiments of the present disclosure.

FIGS. 9A and 9B are simplified side cross-sectional views of the portion 9 of FIG. 8 while a sealing member is in recessed and sealed positions, respectively, in accordance with embodiments of the present disclosure.

DETAILED DESCRIPTION OF ILLUSTRATIVE EMBODIMENTS

Figure 1:
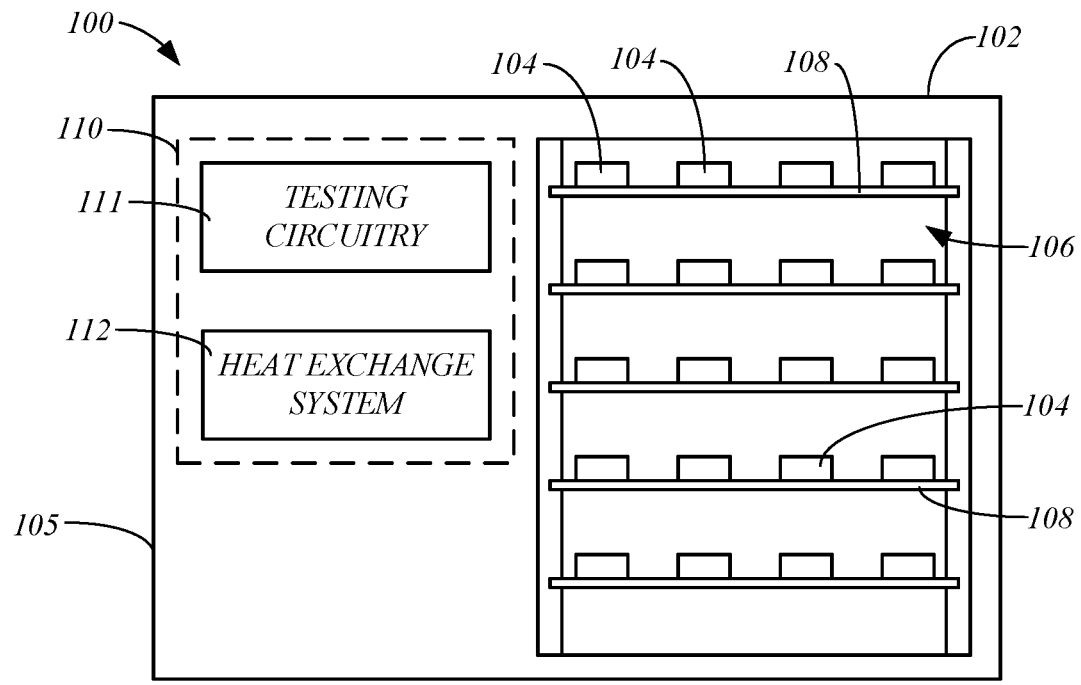
FIG. 1 is a simplified diagram of a burn-in system that includes a semiconductor burn-in oven 102 for testing semiconductor devices, in accordance with embodiments of the present disclosure.

Embodiments of the present disclosure are described more fully hereinafter with reference to the accompanying drawings. Elements that are identified using the same or similar reference characters refer to the same or similar elements. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Specific details are given in the following description to provide a thorough understanding of the embodiments. However, it is understood by those of ordinary skill in the art that the embodiments may be practiced without these specific details. For example, circuits, systems, networks, processes, frames, supports, connectors, motors, processors, and other components may not be shown, or may be shown in block diagram form in order to not obscure the embodiments in unnecessary detail.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Embodiments of the present disclosure may refer to one or more controllers, each of which may represent one or more processors that control components to perform one or more functions described herein in response to the execution of instructions, which may be stored local or remote memory. Such memory may comprise any suitable patent subject matter eligible computer readable media or memory such as, for example, hard disks, CD-ROMs, optical storage devices, or magnetic storage devices. Such computer readable media or memory do not include transitory waves or signals In some embodiments, the processors of the controllers are components of one or more computer-based systems. In some embodiments, each controller includes one or more control circuits, microprocessor-based engine control systems, one or more programmable hardware components, such as a field programmable gate array (FPGA), that are used to control components to perform one or more functions described herein.

FIG. 1 is a simplified diagram of a burn-in system 100 that includes a semiconductor burn-in oven 102 for testing semiconductor devices 104. The burn-in oven 102 includes a housing 105 having a burn-in chamber 106, which may be configured to receive burn-in boards 108, each of which supports multiple devices 104. The system 100 also includes system electronics 110 for controlling functions performed using the burn-in oven 102, such as testing circuitry 111 and a heat exchange system 112, for example.

Figure 2:
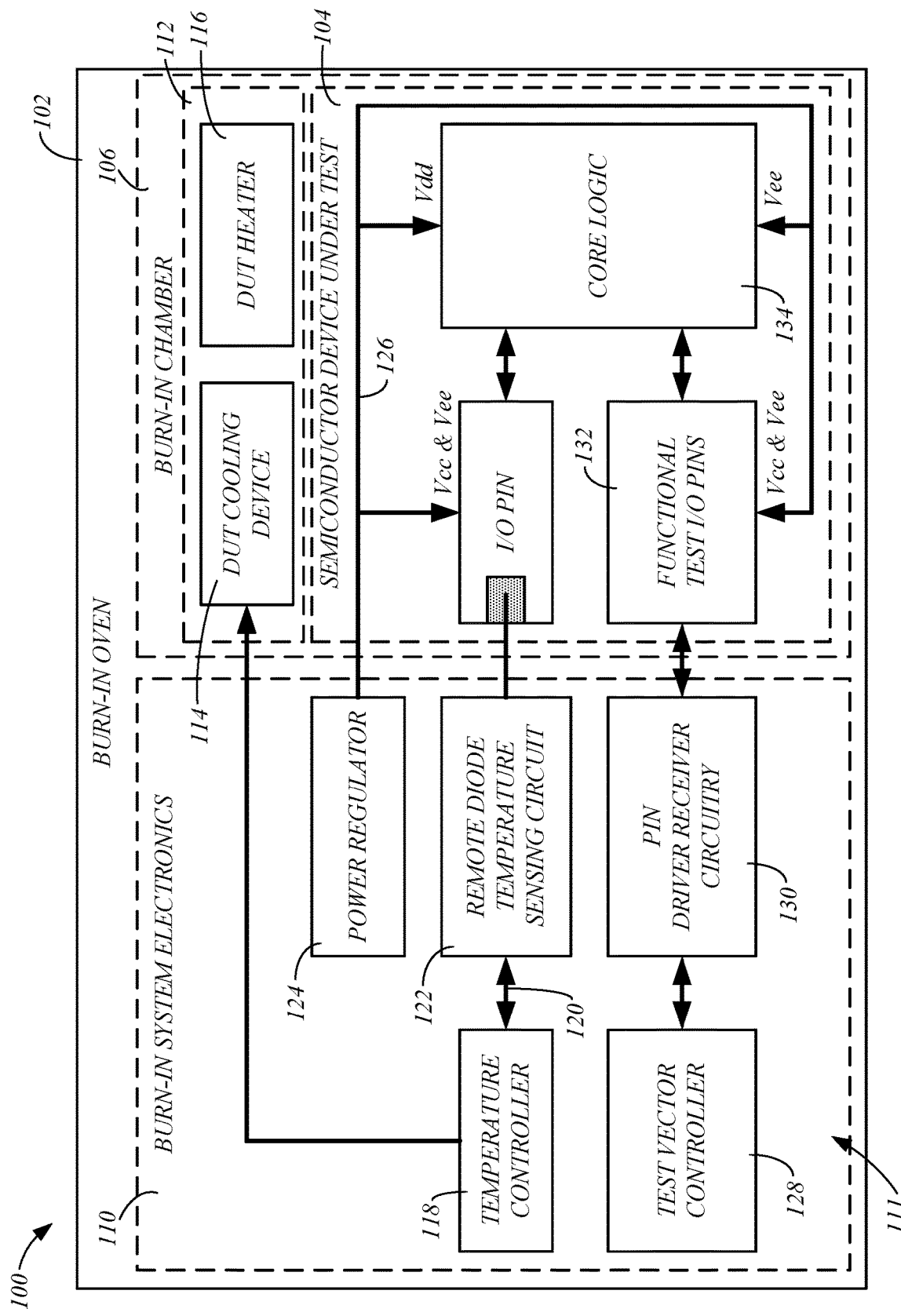
FIG. 2 is a simplified block diagram of an exemplary burn-in system, in accordance with embodiments of the present disclosure.

FIG. 2 is a simplified block diagram of an exemplary burn-in system 100, in accordance with embodiments of the present disclosure. Many of the depicted elements are conventional for burn-in systems and, thus, a detailed explanation of each element is unnecessary. The burn-in system 100 is configured to power and expose the devices 104 under test to heat stress the devices 104 over an extended period of time. As mentioned above, the system 100 may utilize one or more burn-in boards 108 having sockets for supporting a number of semiconductor devices 104 for testing in the chamber 106 of the semiconductor burn-in oven 102. Thus, while only a single device 104 is depicted in FIG. 2, it is understood that embodiments of the invention are applicable to systems that are configured to test multiple devices 104.

In some embodiments, the heat exchange system 112 operates to maintain the devices 104 under test within a desired temperature range to prevent overheating the devices 104, which can potentially damage properly functioning devices. In some embodiments, the heat exchange system 112 includes a cooling device 114 and/or a heating device 116. A temperature controller 118 may be used to control the heat exchange system 112 to maintain the devices 104 within the desired temperature range in response to a temperature output signal 120 from a temperature sensing circuit 122 that senses or obtains a temperature of the device 104, such as through a pin of the device 104, for example. Other techniques for sensing the temperature of the device 104 under test may be used.

The testing circuitry 111 of the system electronics 110 may comprise one or more power stages that include one or more power regulators 124 that are used to supply a desired power 126 to a testing stage of the burn-in system 100. The testing stage handles the application of the power 126 supplied from the power regulators 124 to the semiconductor devices 104. Thus, the power regulators 124 may supply desired voltages to the device 104 under test through conventional power pins (i.e., not I/O pins), such as a positive supply voltage Vcc, a negative supply voltage Vee (e.g., ground), a logic positive supply voltage Vdd, or other voltage, for example.

The testing circuitry 111 may also include electronics, such as a test vector controller 128 and pin driver receiver circuitry 130, that are used to perform various functional tests on the device 104 through a set of functional test I/O pins 132. The functional tests determine whether components of the semiconductor device 104, such as core logic 134 and/or other components, are operating properly during the testing period.

Figure 3:
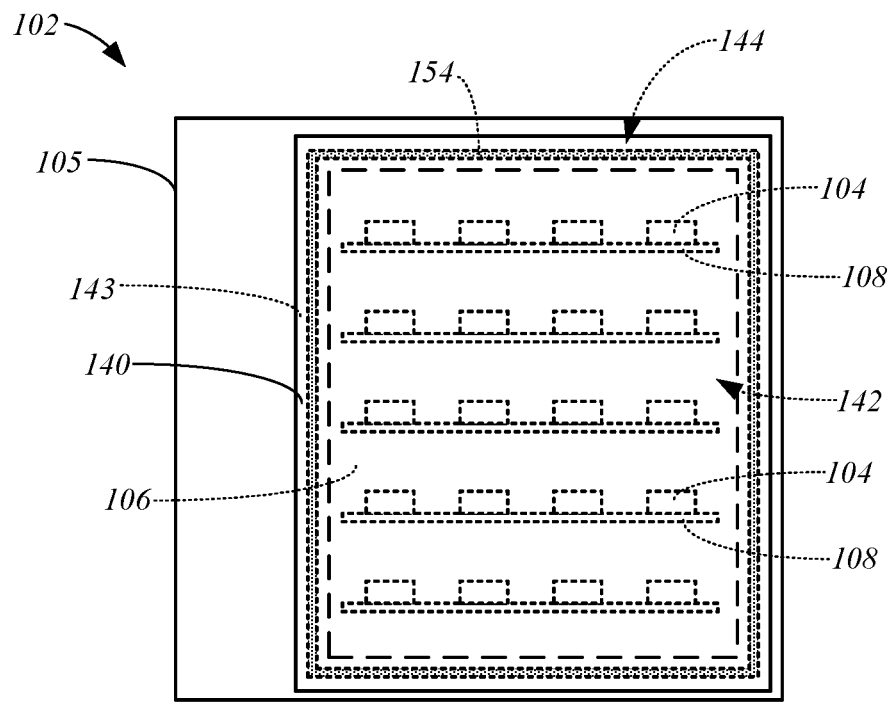
FIG. 3 is a simplified front view of a semiconductor burn-in oven, in accordance with embodiments of the present disclosure.

Embodiments of the present disclosure relate to techniques for sealing the burn-in chamber 106 during testing of semiconductor devices. In some embodiments, the semiconductor burn-in oven 102 includes a door 140 that is configured to cover an opening 142 to the burn-in chamber 106 that is surrounded by a front face 143 of the housing, as shown in FIG. 3, which is a simplified front view of a burn-in oven 102, in accordance with embodiments of the present disclosure. A sealing mechanism 144 operates to provide a seal around the opening 142 between the front face 143 of the housing 105 and an interior side or wall of the door 140. The seal formed by the sealing mechanism 144 isolates the environment within the chamber 106 from the environment surrounding the oven 102. This allows the oven 102 to efficiently control the temperature within the chamber 106, and accurately control the testing of the devices 104.

Figure 4:
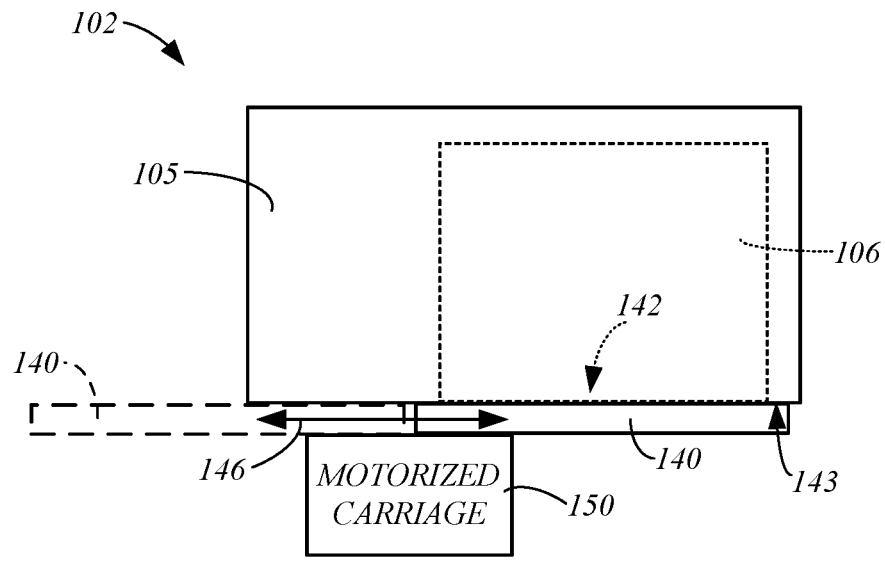
FIGS. 4 and 5 are simplified top views of a semiconductor burn-in oven, each illustrating an example of different operating states of a door, in accordance with embodiments of the present disclosure.
Figure 5:
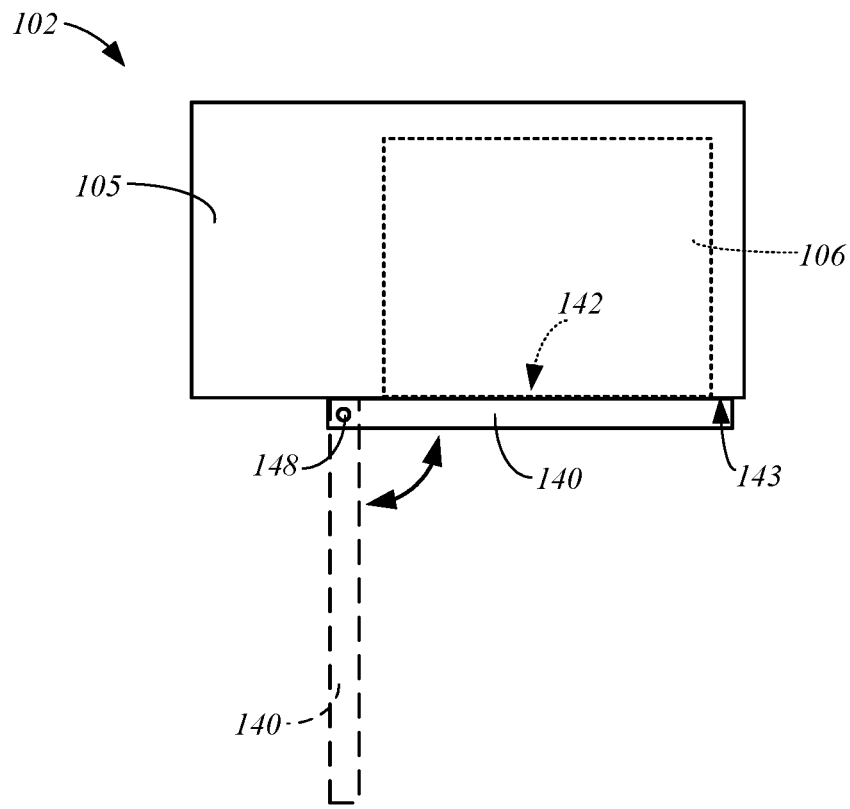

The door 140 may take on any suitable form. FIGS. 4 and 5 are simplified top views of a burn-in oven 102, each illustrating an example of the door 140, in accordance with embodiments of the present disclosure. In one embodiment, the door 140 is configured to slide along an axis 146 that extends along the front face 143 (e.g., parallel to the front face) between a closed position (solid lines), in which the door 140 covers the opening 142 of the chamber 106, and an open position (phantom lines), in which the door 140 is displaced from the opening 142 making the chamber 106 accessible through the opening 142 for the installation of burn-in boards 108 into the chamber 106, or the removal of burn-in boards 108 from the chamber 106, for example. In accordance with another embodiment, the door 140 may transition from the closed position (solid lines) to the open position (phantom lines) by swinging the door 140 about a hinge 148, as indicated in FIG. 5. Other forms for the door 140 may also be used. For example, the door 140 may take the form of a roll-up type door, a folding type door, or another suitable type of door.

The door 140 may be moved between the open and closed positions using a suitable motorized mechanism, such as a motorized carriage 150 that drives the door 140 along the axis 146 (FIG. 4), or another suitable mechanism. In some embodiments, the door 140 may be locked in the closed and/or open position using a suitable locking mechanism.

Figure 6:
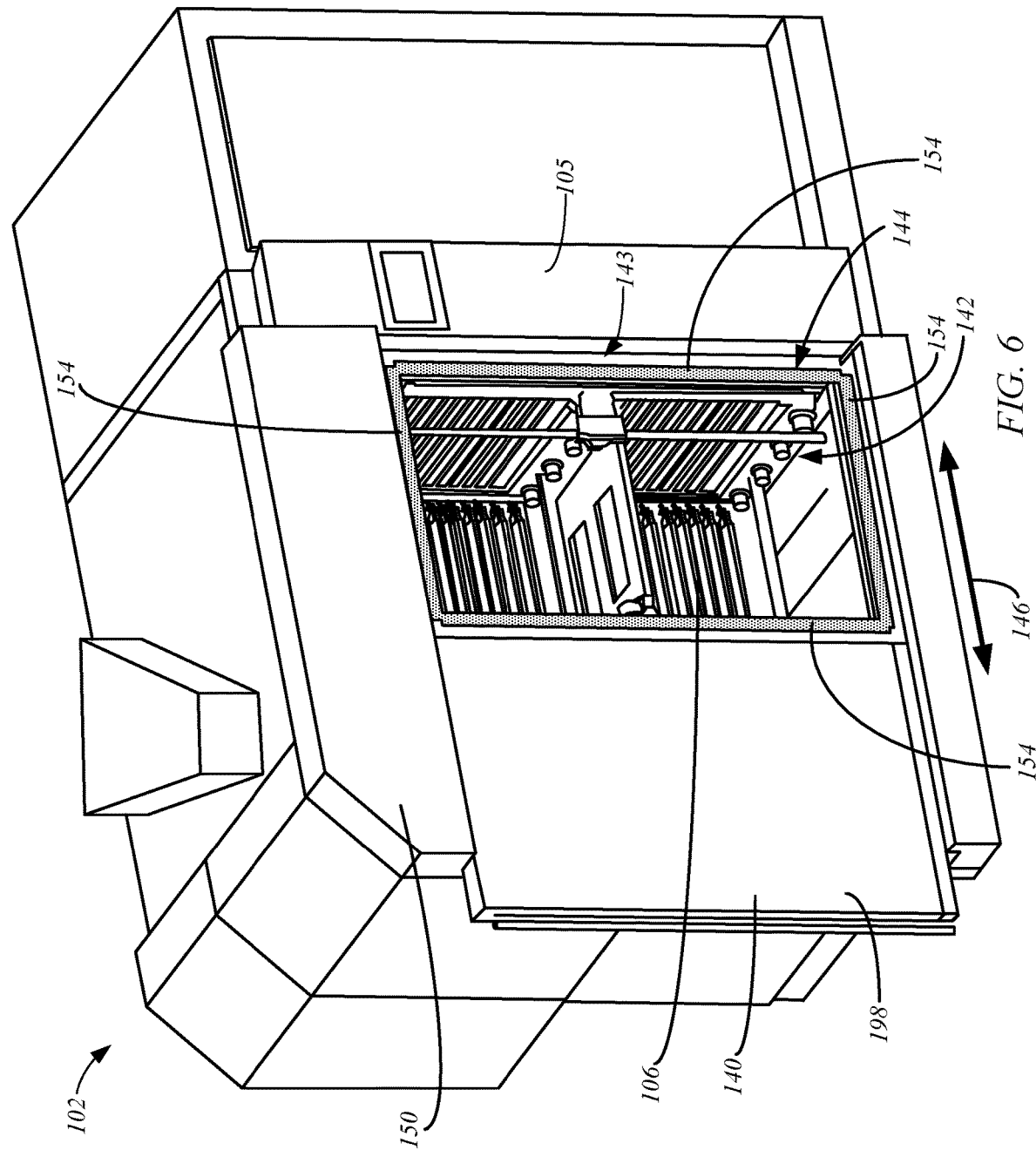
FIGS. 6 and 7 are isometric views of an example of a semiconductor burn-in oven having a door respectively in open and closed positions, in accordance with embodiments of the present disclosure.
Figure 7:
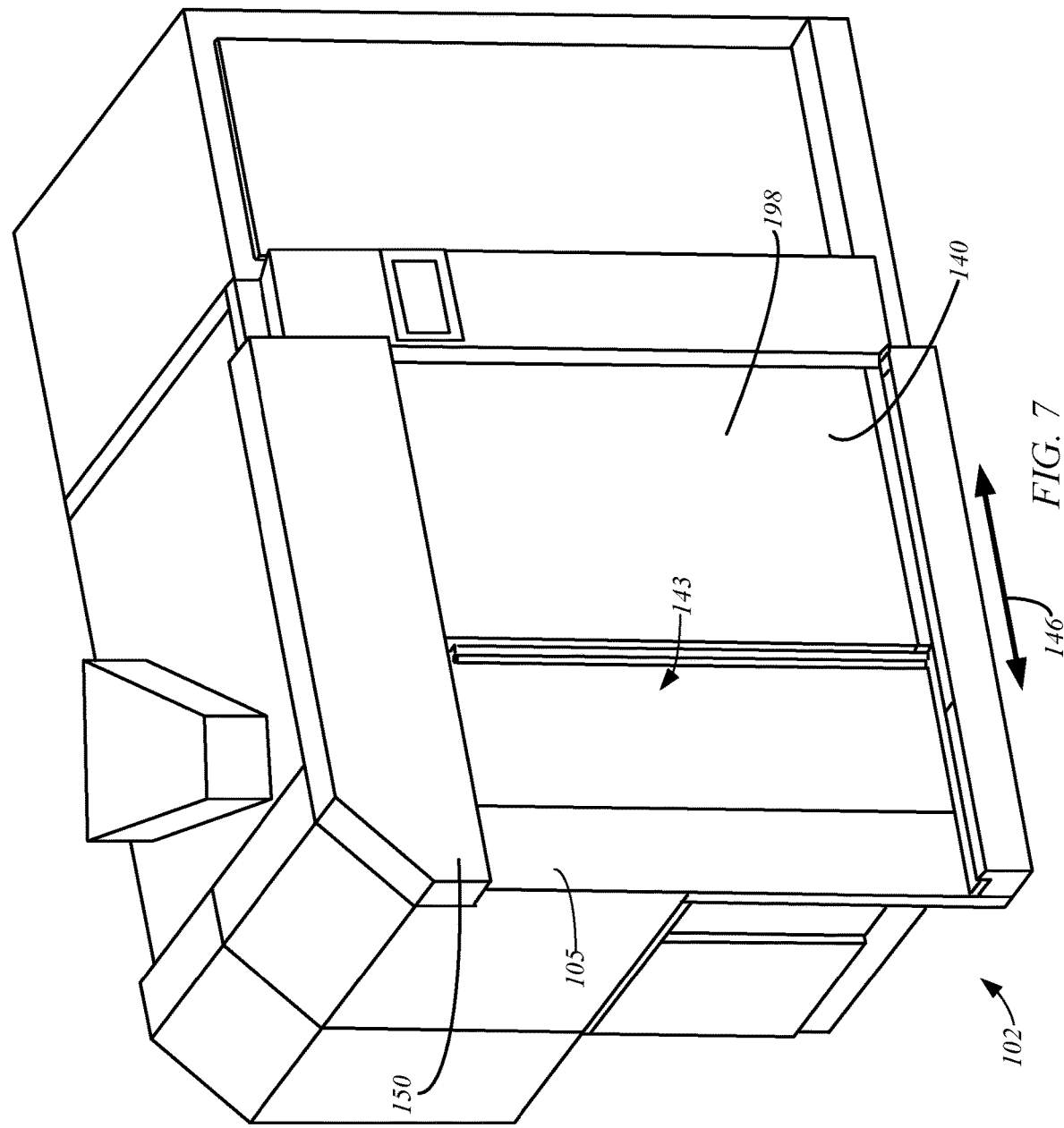

FIGS. 6 and 7 are isometric views of an example of a semiconductor burn-in oven 102 having a door 140 respectively in open and closed positions, in accordance with embodiments of the present disclosure. In the illustrated example, the door 140 is configured to slide along the axis 146 using the motorized carriage 150 between the open position (FIG. 6) and the closed position (FIG. 7). The carriage 150 may include limit switches that mark the end-of-travel limits for the door 140, an encoder for positioning the door at or between the open and closed positions, and other components for controlling the opening and closing of the door 140.

The oven 102 may include safety features, such as a light curtain across the opening for detecting an intrusion into the chamber 106 or across the path of the door 140. When an intrusion is detected, the system electronics 110 may prevent the door 140 from closing, for example. Additionally, the oven 102 may include force detectors that may detect a resistance to movement of the door 140 during an opening and/or closing operation. The detection of a threshold force may trigger the stoppage or reversal of movement of the door 140 by the system electronics 110. The oven may include additional or alternative safety features.

As mentioned above, the sealing mechanism 144 surrounds the opening 142 and operates to seal the chamber 106 when the door 140 is in its closed position by forming a seal between the housing 105 (e.g., front face 143) and the door 140. In some embodiments, the sealing mechanism 144 includes one or more sealing members 154. The one or more sealing members 154 may completely surround the opening 142 to the chamber 106, such as by extending along top, side and bottom edges of the opening 142, as shown in FIGS. 3 and 6.

In one embodiment, each sealing member 154 is attached to the housing 105 of the semiconductor burn-in oven 102, such as at the front face 143. This may be implemented using suitable brackets, or another technique. Alternatively, each sealing member 154 may be attached to the door 140 using suitable brackets, or another technique.

In some embodiments, each sealing member 154 moves between a recessed position, in which a gap extends between the front face 143 of the housing 105 and the interior side of the door in its closed position, and a sealing position, in which each sealing member 154 closes the gap between the front face 143 and the interior side of the door 140 and seals the opening 142 to the chamber 106. The one or more sealing members 154 and the technique for transitioning the sealing member 154 between the recessed and sealing positions may take on various forms.

FIG. 8 is a simplified diagram of an example of the sealing mechanism 144, in accordance with embodiments of the present disclosure. FIGS. 9A and 9B are simplified side cross-sectional views of the portion 9 of FIG. 8 while an example of a sealing member 154 is in the recessed and sealed positions, respectively. While the sealing member 154 is shown as being attached to the housing 105, it is understood that embodiments include the attachment of the sealing member 154 to the door 140.

In some embodiments, the sealing member 154 is configured to have inflated and deflated states. The recessed position (FIG. 9A) of the sealing member 154 corresponds to the deflated state, and the sealing position (FIG. 9B) of the sealing member 154 corresponds to the inflated state.

In some embodiments, the sealing mechanism 144 includes a controller 160 and suitable valving, such as an input valve 162 and an output valve 164, as shown in FIG. 8. The valves 162 and 164 may comprise solenoid valves or another suitable valve. The input valve 162 is connected to a compressed air supply 166, such as a tank of compressed air, and an interior chamber 167 of the sealing member 154. Alternatively, the sealing mechanism 144 may include a compressor for generating the compressed air supply 166. The output valve 164 may be connected to the interior chamber 167 of the sealing member 154 and atmospheric pressure.

The controller 160 may place the sealing member 154 in its recessed position or deflated state (FIG. 9A) by opening the output valve 164 to atmospheric pressure, in which pressurized air within the interior chamber 167 is released, which collapses the sealing member 154. In some embodiments, a gap 168 is formed between an interior surface 170 of the door 140 and the front face 143 of the housing 105 and/or an engaging surface 172 of the sealing member 154, when the sealing member 154 is in the recessed position or deflated state, as shown in FIG. 9A. Thus, in some embodiments, the sealing member 154 does not contact the interior side 170 of the door 140 when in the recessed position. This allows the door 140 to transition between its open and closed positions without encumbrance by the sealing member 154. This may be particularly useful when the door 140 is configured to slide along the axis 146 (FIGS. 4 and 6).

The controller 160 may transition the sealing member 154 from its recessed position or deflated state to its sealing position or inflated state by closing the output valve 164 and opening the input valve 162. This drives a flow of compressed air 174 into the interior chamber 167 of the sealing member 154, which pressurizes the interior chamber 167 to a desired pressure and transitions the sealing member 154 from the recessed position/deflated state (FIG. 9A) to the sealing position/inflated state (FIG. 9B), in which the engaging surface 172 of the sealing member 154 closes the gap 168 and engages the interior side 170 of the door 140 surrounding the opening 142 to the chamber 106 to seal the opening 142.

The pressure of the interior chamber 167 may be controlled using a suitable pressure regulator or pressure regulating valve 162, for example. The sealing member 154 may be formed of any suitable material, such as silicone, or another suitable material capable of handling the anticipated temperatures to which the chamber 106 may be heated, such as 150° C., for example, while providing the desired sealing function.

The sealing mechanism 154 may also be transitioned between the recessed (FIG. 9A) and sealing (FIG. 9B) positions using other techniques. For example, the flow of compressed air 174 may be used to drive an intermediary mechanism, which in turn transitions the sealing member 154 from the recessed position to the sealing position. Additionally, the sealing mechanism 154 may be transitioned between the recessed and sealing positions using a motorized mechanism, as an alternative to compressed air.

Figure 10:
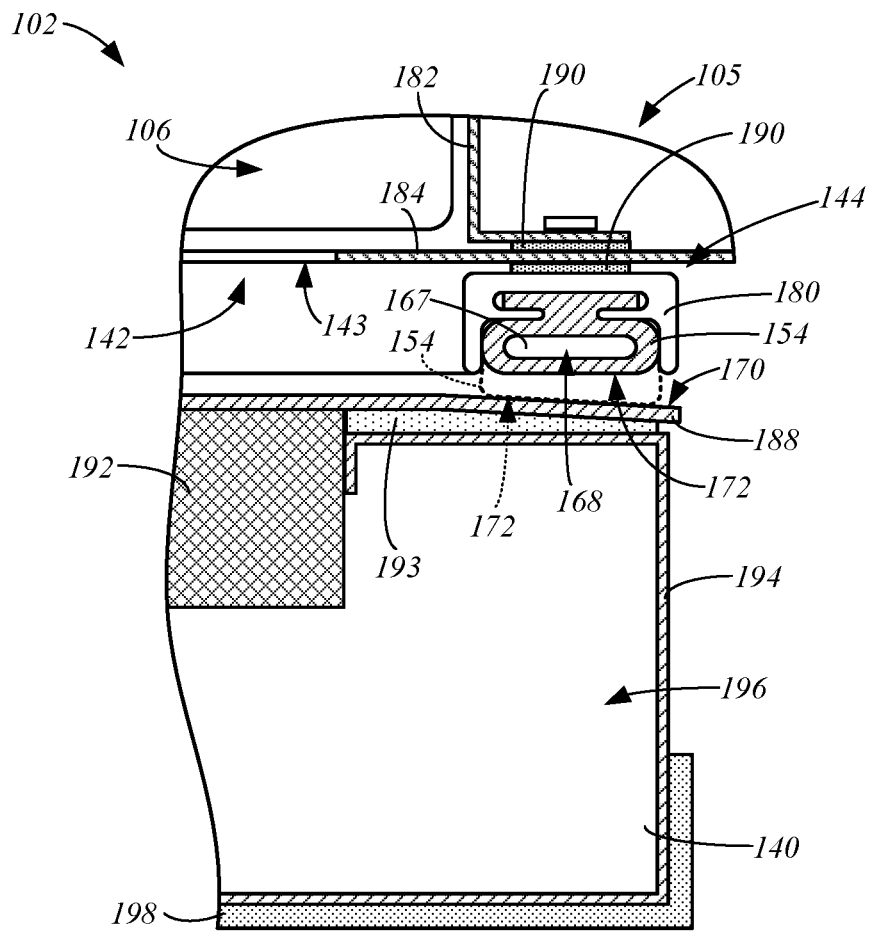
FIG. 10 is a side cross-sectional view of an example of a portion of an interface between a sealing member and a door of a semiconductor burn-in oven, in accordance with embodiments of the present disclosure.
Figure 11:
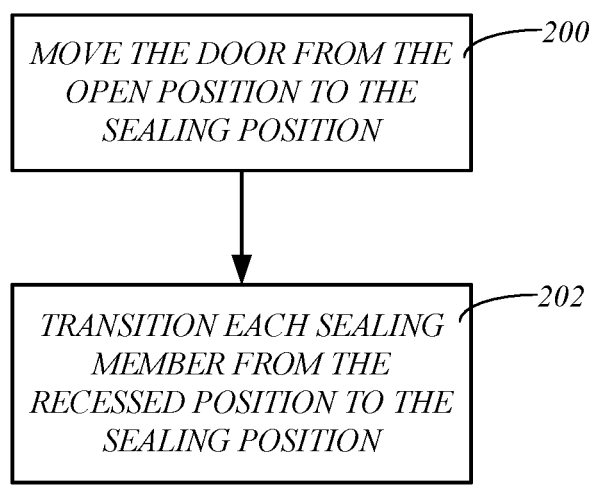
FIG. 11 is a flowchart illustrating a method of operating a semiconductor burn-in oven, in accordance with embodiments of the present disclosure.

FIG. 10 is a side cross-sectional view of an example of a portion of the interface between a sealing member 154 in its recessed or deflated state, and the door 140 in its closed position, in accordance with embodiments of the present disclosure. The one or more sealing members 154 may each be received within a bracket or bracket sections 180 that extend around the opening 142, such as from the front face 143, for example. The bracket may be connected to a sheet metal chassis 182 of the housing 105 of the oven 102 and/or a chamber wall 184 of the housing 105.

The door 140 comprises an interior wall 188, which may include a stainless-steel plate having the surface 170 that is engaged by the surface 172 of the sealing member 154 when it is transitioned to the sealing position/inflated state (phantom lines). The opening 142 is closed and sealed by the wall 188 and the sealing member 154.

The burn-in oven 102 may include a thermal break to prevent or reduce the transfer of heat from the chamber 106 to the sealing member 154 and exterior surfaces of the oven 102, such as by ensuring that the air within the chamber 106 has no direct contact with the sheet metal that constructs the chassis 182. For example, silicone seals 190 may be used to thermally isolate the bracket 180, the chassis 182, and the sealing member 154 from the chamber wall 184. Additionally, the bracket 180 may be formed of Ultem or other suitable thermal insulating material.

The door 140 may also be insulated to reduce heat transfer from the chamber 106 to the environment surrounding the oven 102. For example, thermal insulation 192 may be contained within an interior cavity of the door 140, particularly over the region of the door 140 corresponding to the opening 142 to the oven chamber 106. A silicone rubber seal 193 may insulate the interior wall 188 of the door 140 from a frame 194 of the door 140. Air gaps 196 may also be provided within the door 140 between the interior wall 188 and a front wall 198 to further insulate the exterior of the door 140 from the oven chamber 106.

Additional embodiments of the present disclosure are directed to methods of operating a semiconductor burn-in oven 102 formed in accordance with one or more embodiments described herein, such as those described above with reference to FIGS. 1-10. At 200 of the method, the door 140 is moved from the open position, in which the burn-in chamber is accessible through the opening 142, to the closed position, in which the door covers the opening 142, such as illustrated in FIGS. 4 and 5. In one embodiment, each sealing member 154 is in the recessed position (FIGS. 9A and 10) during step 200. In one embodiment, a gap 168 extends between the front face 143 of the housing 105 and the interior side or surface 170 of the door 140.

At 202 of the method, each of the one or more sealing members 154 is transitioned from the recessed position to the sealing position (FIGS. 9B and 10 (phantom lines)), which closes the gap 168 and forms a seal between the front face 143 of the housing 105 and the interior side 170 of the door, and closes the opening 142 to the burn-in chamber 106. One embodiment of step 202 involves directing a flow of compressed air 174 into an interior chamber 167 of each sealing member 154, such as discussed above with reference to FIGS. 8, 9A and 9B.

Although the embodiments of the present disclosure have been described with reference to preferred embodiments, workers skilled in the art will recognize that changes may be made in form and detail without departing from the spirit and scope of the present disclosure.

What is claimed is:

1. A semiconductor burn-in oven comprising:
    a housing including a burn-in chamber and an opening to the burn-in chamber surrounded by a front face;
    a heating device configured to heat the burn-in chamber;
    testing circuitry configured to power semiconductor devices received within the burn-in chamber;
    a door having open position, in which the burn-in chamber is accessible through the opening, and a closed position, in which the door covers the opening; and
    a sealing mechanism configured to form a seal around the opening between an interior side of the door and the front face of the housing when the door is in the closed position, the sealing mechanism comprising at least one sealing member having a recessed position, in which a gap extends between the front face of the housing and the interior side of the door, and a sealing position, in which that at least one sealing member closes the gap and forms the seal.

2. The semiconductor burn-in oven of claim 1, wherein:
    the sealing mechanism includes a compressed air supply;
    the sealing mechanism is configured to direct a flow of compressed air from the compressed air supply into an interior chamber of each sealing member to inflate each sealing member and transition each sealing member from the recessed position to the sealing position; and
    the sealing mechanism is configured to direct a flow of air out of the interior chamber of each sealing member to transition each sealing member from the sealing position to the recessed position.

3. The semiconductor burn-in oven of claim 2, wherein the sealing mechanism comprises:

an input valve configured to control the flow of compressed air from the compressed air supply to the interior chamber of each sealing member; and an output valve configured to control the flow of air out of the interior chamber of each sealing member.

4. The semiconductor burn-in oven of claim 3, wherein the sealing mechanism comprises a controller configured to control the input valve and the output valve.

5. The semiconductor burn-in oven of claim 1, wherein:
each sealing member is attached to the housing; and
the burn-in oven includes a thermal break between the burn-in chamber and each of the sealing mechanisms.

6. The semiconductor burn-in oven of claim 5, wherein:
the burn-in oven includes a plurality of brackets attached to the housing that support the at least one sealing member; and
the thermal break comprises a thermal insulator between each bracket and the housing.

7. The semiconductor burn-in oven of claim 6, wherein the thermal insulator comprises a silicone seal.

8. The semiconductor burn-in oven of claim 1, further comprising a motorized carriage configured to drive the door along an axis that extends along the front face of the housing between the open and closed positions.

9. The semiconductor burn-in oven of claim 1, further comprising a hinge connecting the door to the housing, wherein the door is configured to swing on the hinge between the open and closed positions.

10. A semiconductor burn-in oven comprising:
a housing including a burn-in chamber and an opening to the burn-in chamber surrounded by a front face;
a heating device configured to heat the burn-in chamber;
testing circuitry configured to power semiconductor devices received within the burn-in chamber;
a door having open position, in which the burn-in chamber is accessible through the opening, and a closed position, in which the door covers the opening;
a motorized carriage configured to drive the door along an axis that extends along the front face of the housing between the open and closed positions; and
a sealing mechanism configured to form a seal around the opening between an interior side of the door and the front face of the housing when the door is in the closed position, the sealing mechanism comprising:
at least one sealing member each having a recessed position, in which a gap extends between the front face of the housing and the interior side of the door, and a sealing position, in which the at least one sealing member closes the gap and forms the seal; and
a supply of compressed air,
wherein:
the sealing mechanism is configured to direct a flow of compressed air from the compressed air supply into an interior chamber of each sealing member to inflate each sealing member and transition each sealing member from the recessed position to the sealing position; and
the sealing mechanism is configured to direct a flow of air out of the interior chamber of each sealing member to transition each sealing member from the sealing position to the recessed position.

11. The semiconductor burn-in oven of claim 10, wherein the sealing mechanism comprises:

an input valve configured to control the flow of compressed air from the compressed air supply to the interior chamber of each sealing member; and an output valve configured to control the flow of air out of the interior chamber of each sealing member.

12. The semiconductor burn-in oven of claim 11, wherein the sealing mechanism comprises a controller configured to control the input valve and the output valve.

13. The semiconductor burn-in oven of claim 12, wherein:
each sealing member is attached to the housing; and
the burn-in oven includes a thermal break between the burn-in chamber and each of the sealing mechanisms.

14. The semiconductor burn-in oven of claim 13, wherein:
the burn-in oven includes a plurality of brackets attached to the housing that support the at least one sealing member; and
the thermal break comprises a thermal insulator between each bracket and the housing.

15. The semiconductor burn-in oven of claim 14, wherein the thermal insulator comprises a silicone seal.

16. A method of operating a semiconductor burn-in oven, wherein the semiconductor burn-in oven comprises:
a housing defining a burn-in chamber and including an opening to the burn-in chamber surrounded by a front face of the housing;
a heating device configured to heat the burn-in chamber;
testing circuitry configured to power semiconductor devices received within the burn-in chamber;
a door having an open position, in which the burn-in chamber is accessible through the opening, and a closed position, in which the door covers the opening; and
a sealing mechanism comprising at least one sealing member,
wherein the method comprises:
moving the door from the open position to the closed position;
transitioning each sealing member from a recessed position, in which a gap extends between the front face of the housing and an interior side of the door, to a sealing position, in which each sealing member closes the gap and forms a seal between the front face of the housing and the interior side of the door.

17. The method of claim 16, wherein transitioning each sealing member from the recessed position to the sealing position comprises directing a flow of air from a compressed air supply into an interior chamber of each sealing member.

18. The method of claim 17, further comprising transitioning each sealing member from the sealing position to the recessed position comprising discharging air from within the interior chamber of each sealing member.

19. The method of claim 18, further comprising controlling the transitioning of the at least sealing member from the recessed position to the sealing position using a controller and an input valve, and controlling the transitioning of the at least one sealing member from the sealing position to the recessed position using the controller and an output valve.

20. The method of claim 19, wherein moving the door from the open position to the closed position comprises driving the door along an axis that extends along the front face of the housing using a motorized carriage.

* * * * *